(12) United States Patent
Trika

(10) Patent No.: US 11,074,172 B2
(45) Date of Patent: Jul. 27, 2021

(54) ON-DEVICE-COPY FOR HYBRID SSD WITH SECOND PERSISTENT STORAGE MEDIA UPDATE OF LOGICAL BLOCK ADDRESS FOR FIRST PERSISTENT STORAGE MEDIA DATA

(71) Applicant: Intel Corporation, Santa Clara, CA (US)

(72) Inventor: Sanjeev Trika, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/244,285

(22) Filed: Jan. 10, 2019

(65) Prior Publication Data

US 2019/0146913 A1 May 16, 2019

(51) Int. Cl.
*G06F 12/02* (2006.01)
*G06F 3/06* (2006.01)
*G11C 13/00* (2006.01)

(52) U.S. Cl.
CPC .......... *G06F 12/0246* (2013.01); *G06F 3/061* (2013.01); *G06F 3/065* (2013.01); *G06F 3/0659* (2013.01); *G06F 3/0685* (2013.01); *G06F 12/0238* (2013.01); *G11C 13/0004* (2013.01); *G06F 2212/1016* (2013.01); *G06F 2212/217* (2013.01); *G06F 2212/7201* (2013.01); *G06F 2212/7205* (2013.01)

(58) Field of Classification Search
CPC .. G06F 12/0246; G06F 12/0238; G06F 3/061; G06F 3/0685; G06F 3/0659; G06F 3/065; G06F 2212/1016; G06F 2212/217; G06F 2212/7205; G06F 2212/7201; G06F 3/0665; G06F 3/0641; G11C 13/0004
USPC ................................ 711/202, 206, 118, 103
See application file for complete search history.

(56) References Cited

U.S. PATENT DOCUMENTS

| | | | |
|---|---|---|---|
| 6,138,226 A * | 10/2000 | Yoshioka ............ | G06F 12/1063 711/210 |
| 9,448,922 B2 | 9/2016 | Trika et al. | |
| 2014/0068216 A1* | 3/2014 | Chung .................. | G06F 3/0646 711/162 |
| 2015/0325285 A1* | 11/2015 | Tsutsui ................ | H01L 27/0688 365/154 |
| 2016/0062885 A1* | 3/2016 | Ryu ..................... | G06F 12/0246 711/103 |
| 2017/0177243 A1 | 6/2017 | Trika et al. | |
| 2018/0121109 A1* | 5/2018 | Li .......................... | G06F 3/0611 |
| 2019/0042098 A1* | 2/2019 | Li ........................... | G06F 3/068 |

(Continued)

*Primary Examiner* — Hong C Kim
(74) *Attorney, Agent, or Firm* — Jordan IP Law, LLC

(57) ABSTRACT

An embodiment of a package apparatus may include technology to control a first persistent storage media of the electronic storage, control a second persistent storage media of the electronic storage, wherein the second persistent storage media includes one or more of a faster access time and a smaller granularity access as compared to the first persistent storage media, store a logical-to-physical table in the second persistent storage media, and, in response to a data copy command, update an entry in the logical-to-physical table corresponding to a destination logical block address for the data copy command to point to a same physical address as a source logical block address for the data copy command. Other embodiments are disclosed and claimed.

20 Claims, 11 Drawing Sheets

(56) References Cited

U.S. PATENT DOCUMENTS

| | | | |
|---|---|---|---|
| 2019/0065394 A1* | 2/2019 | Lee | G06F 12/0246 |
| 2019/0163621 A1* | 5/2019 | Doh | G06F 3/064 |
| 2020/0089608 A1* | 3/2020 | Chou | G06F 12/0253 |
| 2020/0125488 A1* | 4/2020 | Byun | G06F 12/10 |

* cited by examiner

ON-DEVICE-COPY FOR HYBRID SSD WITH SECOND PERSISTENT STORAGE MEDIA UPDATE OF LOGICAL BLOCK ADDRESS FOR FIRST PERSISTENT STORAGE MEDIA DATA

TECHNICAL FIELD

Embodiments generally relate to storage systems. More particularly, embodiments relate to an on-device-copy for a hybrid solid state drive (SSD).

BACKGROUND

A persistent storage device, such as a SSD, may include media such as NAND memory. Memory and storage devices generally include error correction technology. Some devices may utilize ECCs to correct data errors. A logic-to-physical (L2P) table may provide a translation between logical and physical addresses. A physical-to-logical (P2L) table may provide a translation between physical and logical addresses.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Various embodiments described herein may include a memory component and/or an interface to a memory component. Such memory components may include volatile and/or nonvolatile (NV) memory (NVM). Volatile memory may be a storage medium that requires power to maintain the state of data stored by the medium. Non-limiting examples of volatile memory may include various types of random access memory (RAM), such as dynamic RAM (DRAM) or static RAM (SRAM). One particular type of DRAM that may be used in a memory module is synchronous dynamic RAM (SDRAM). In particular embodiments, DRAM of a memory component may comply with a standard promulgated by Joint Electron Device Engineering Council (JEDEC), such as JESD79F for double data rate (DDR) SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at www.jedec.org). Such standards (and similar standards) may be referred to as DDR-based standards and communication interfaces of the storage devices that implement such standards may be referred to as DDR-based interfaces.

NVM may be a storage medium that does not require power to maintain the state of data stored by the medium. In one embodiment, the memory device may include a block addressable memory device, such as those based on NAND or NOR technologies. A memory device may also include future generation nonvolatile devices, such as a three dimensional (3D) crosspoint memory device, or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor RAM (FeTRAM), anti-ferroelectric memory, magnetoresistive RAM (MRAM) memory that incorporates memristor technology, resistive memory including the metal oxide base, the oxygen vacancy base and the conductive bridge RAM (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The memory device may refer to the die itself and/or to a packaged memory product. In particular embodiments, a memory component with non-volatile memory may comply with one or more standards promulgated by the JEDEC, such as JESD218, JESD219, JESD220-1, JESD223B, JESD223-1, or other suitable standard (the JEDEC standards cited herein are available at jedec.org).

Figure 1:
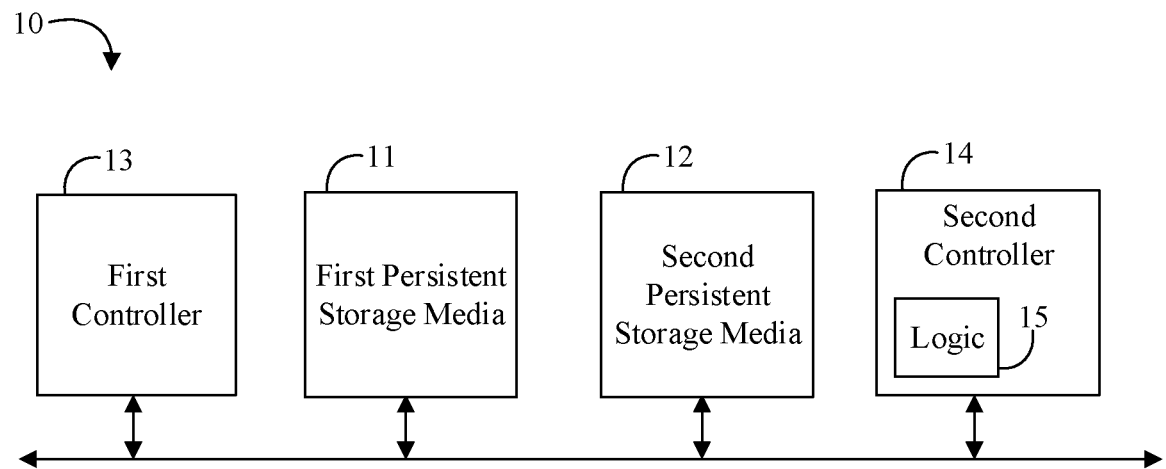
FIG. 1 is a block diagram of an example of an electronic processing system according to an embodiment.

Turning now to FIG. 1, an embodiment of an electronic storage system 10 may include a first persistent storage media 11, and a second persistent storage media 12, where the second persistent storage media 12 may include one or more of a faster access time and a smaller granularity access as compared to the first persistent storage media 11. For example, the second persistent storage media may include NVM (e.g., as described in more detail below) or persistent volatile memory (e.g., battery or capacitor backed-up DRAM or SRAM). For example, some SSDs may include POWER LOSS IMMINENT (PLI) technology with energy storing capacitors. The energy storing capacitors may provide enough energy (power) to complete any commands in progress and to make sure that any data in the DRAMs/SRAMs is committed to the non-volatile NAND media. The capacitors may act as backup batteries for the SSD.

The system 10 may further include a first controller 13 communicatively coupled to the first persistent storage media 11, and a second controller 14 communicatively coupled to the second persistent storage media 12. In some embodiments, the second controller 14 may include logic 15 to store a L2P table in the second persistent storage media 12, and, in response to a data copy command, update an entry in the L2P table corresponding to a destination logical block address (LBA) for the data copy command to point to a same physical address as a source LBA for the data copy command. In some embodiments, the logic 15 may be further configured to store a P2L table in the second persistent storage media 12, and, in response to the data copy command, update an entry in the P2L table corresponding to the physical address to point to both the destination LBA for the data copy command and the source LBA for the data copy command.

In some embodiments, the logic 15 may also be configured to trim the destination LBA prior to the update of the L2P table. For example, the logic 15 may be configured to invalidate the entry in the L2P table corresponding to the destination LBA, and remove the destination LBA from the entry in the P2L table corresponding to the physical address. In some embodiments, the logic 15 may also be configured to, in response to a data write command, determine if a physical address corresponding to a LBA for the data write command is valid, and, if the physical address is determined to be valid, remove the LBA for the data write command from an entry in the P2L table corresponding to the physical address. In any of the embodiments herein, the first persistent storage media 11 may include NAND media and the second persistent storage media 12 may include phase change media. In some embodiments, the logic 15 may be located in, or co-located with, various components, including the second controller 14 (e.g., on a same die).

Embodiments of each of the above first persistent storage media 11, second persistent storage media 12, first controller 13, second controller 14, logic 15, and other system components may be implemented in hardware, software, or any suitable combination thereof. For example, hardware implementations may include configurable logic such as, for example, programmable logic arrays (PLAs), field programmable gate arrays (FPGAs), complex programmable logic devices (CPLDs), or fixed-functionality logic hardware using circuit technology such as, for example, application specific integrated circuit (ASIC), complementary metal oxide semiconductor (CMOS) or transistor-transistor logic (TTL) technology, or any combination thereof. Embodiments of the first and/or second controllers 13, 14 may include a general purpose controller, a special purpose controller, a memory controller, a storage controller, a micro-controller, a processor, a central processor unit (CPU), etc.

Alternatively, or additionally, all or portions of these components may be implemented in one or more modules as a set of logic instructions stored in a machine- or computer-readable storage medium such as random access memory (RAM), read only memory (ROM), programmable ROM (PROM), firmware, flash memory, etc., to be executed by a processor or computing device. For example, computer program code to carry out the operations of the components may be written in any combination of one or more operating system (OS) applicable/appropriate programming languages, including an object-oriented programming language such as PYTHON, PERL, JAVA, SMALLTALK, C++, C# or the like and conventional procedural programming languages, such as the "C" programming language or similar programming languages. For example, the first and/or second persistent storage media 11, 12, or other system memory may store a set of instructions which when executed by the first and/or second controllers 13, 14 cause the system 10 to implement one or more components, features, or aspects of the system 10 (e.g., the controllers 12, 13, the logic 15, storing the L2P table, storing the P2L table, updating the L2P table, updating the P2L table, etc.).

Figure 2:
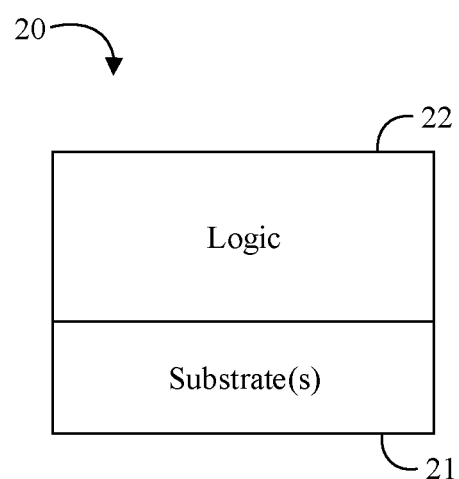
FIG. 2 is a block diagram of an example of a package apparatus according to an embodiment.

Turning now to FIG. 2, an embodiment of a package apparatus 20 for use with electronic storage may include one or more substrates 21, and logic 22 coupled to the one or more substrates 21, wherein the logic 22 is at least partly implemented in one or more of configurable logic and fixed-functionality hardware logic. The logic 22 coupled to the one or more substrates 21 may be configured to control a first persistent storage media of the electronic storage, control a second persistent storage media of the electronic storage, wherein the second persistent storage media includes one or more of a faster access time and a smaller granularity access as compared to the first persistent storage media, store a L2P table in the second persistent storage media, and, in response to a data copy command, update an entry in the L2P table corresponding to a destination LBA for the data copy command to point to a same physical address as a source LBA for the data copy command. In some embodiments, the logic 22 may be further configured to store a P2L table in the second persistent storage media, and, in response to the data copy command, update an entry in the P2L table corresponding to the physical address to point to both the destination LBA for the data copy command and the source LBA for the data copy command.

In some embodiments, the logic 22 may also be configured to trim the destination LBA prior to the update of the L2P table. For example, the logic 22 may be configured to invalidate the entry in the L2P table corresponding to the destination LBA, and remove the destination LBA from the entry in the P2L table corresponding to the physical address. In some embodiments, the logic 22 may also be configured to, in response to a data write command, determine if a physical address corresponding to a LBA for the data write command is valid, and, if the physical address is determined to be valid, remove the LBA for the data write command from an entry in the P2L table corresponding to the physical address. In any of the embodiments herein, the first persistent storage media may include NAND media and the second persistent storage media may include phase change media. In some embodiments, the logic 22 coupled to the one or more substrates 21 may include transistor channel regions that are positioned within the one or more substrates 21.

Embodiments of logic 22, and other components of the apparatus 20, may be implemented in hardware, software, or any combination thereof including at least a partial implementation in hardware. For example, hardware implementations may include configurable logic such as, for example, PLAs, FPGAs, CPLDs, or fixed-functionality logic hardware using circuit technology such as, for example, ASIC, CMOS, or TTL technology, or any combination thereof. Additionally, portions of these components may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages.

The apparatus 20 may implement one or more aspects of the method 25 (FIGS. 3A to 3C), the method 60 (FIG. 6), the method 70 (FIG. 7), the method 80 (FIG. 8), the method 88 (FIG. 9), or any of the embodiments discussed herein. In some embodiments, the illustrated apparatus 20 may include the one or more substrates 21 (e.g., silicon, sapphire, gallium arsenide) and the logic 22 (e.g., transistor array and other integrated circuit/IC components) coupled to the substrate(s) 21. The logic 22 may be implemented at least partly in configurable logic or fixed-functionality logic hardware. In one example, the logic 22 may include transistor channel regions that are positioned (e.g., embedded) within the substrate(s) 21. Thus, the interface between the logic 22 and the substrate(s) 21 may not be an abrupt junction. The logic 22 may also be considered to include an epitaxial layer that is grown on an initial wafer of the substrate(s) 21.

Figure 3A:
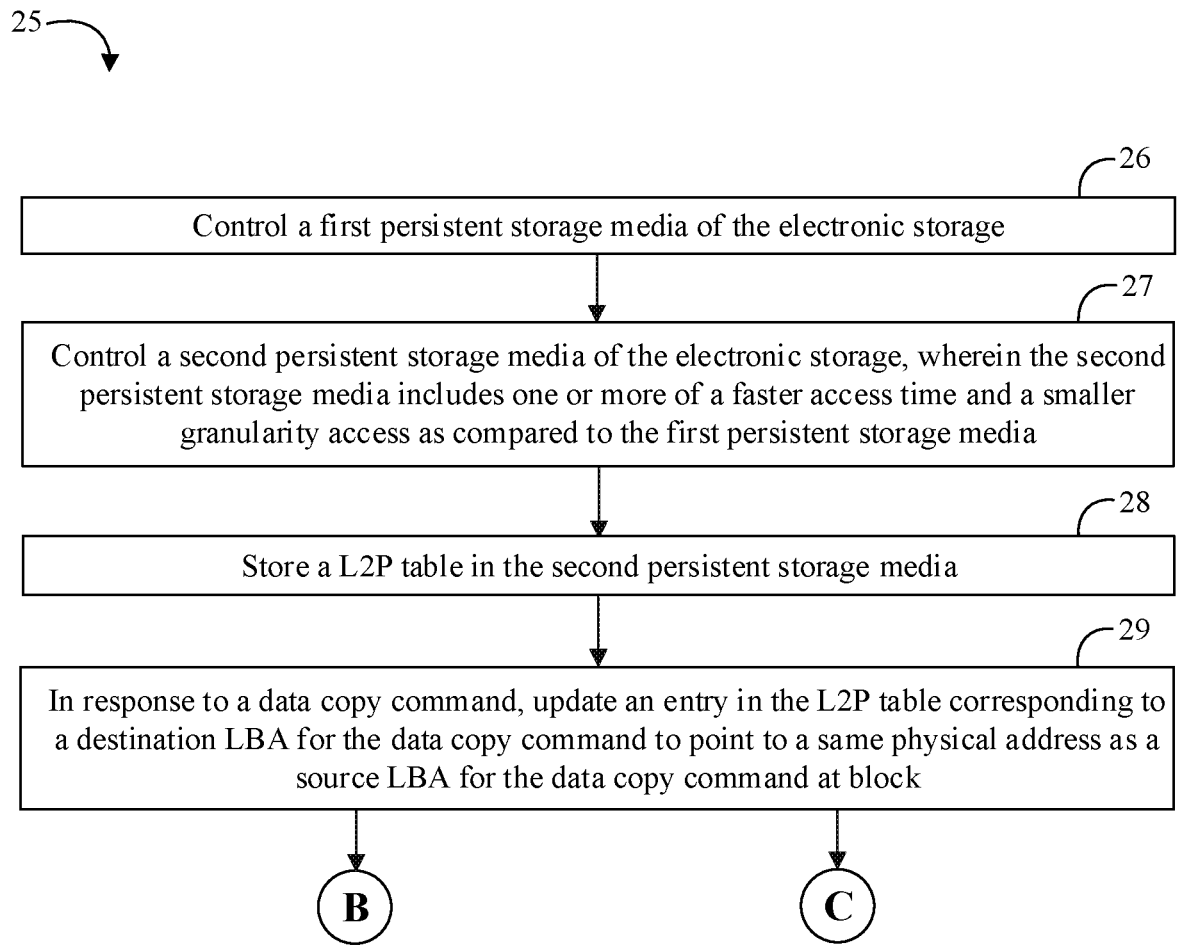
FIGS. 3A to 3C are flowcharts of an example of a method of controlling electronic storage according to an embodiment.
Figure 3B:
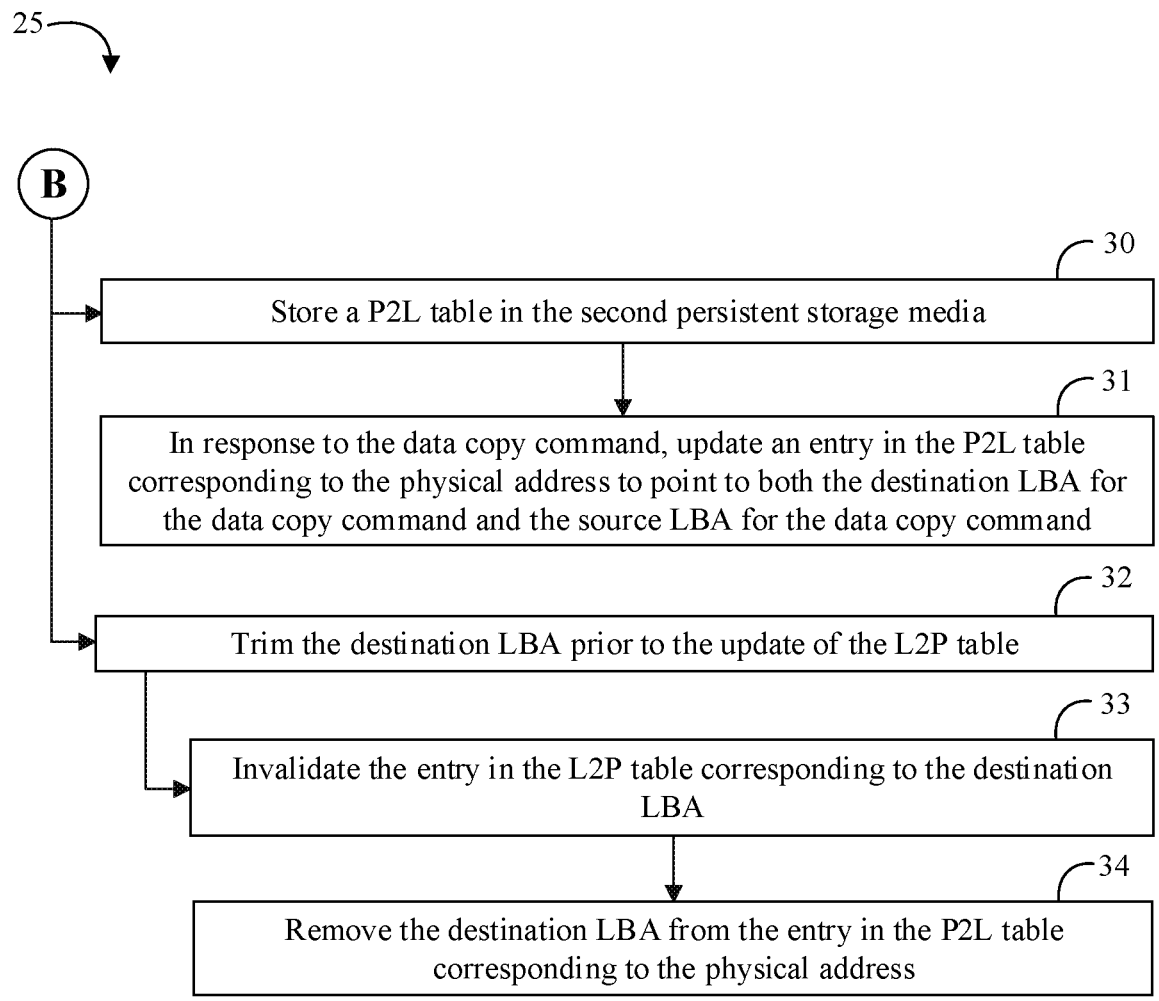
Figure 3C:
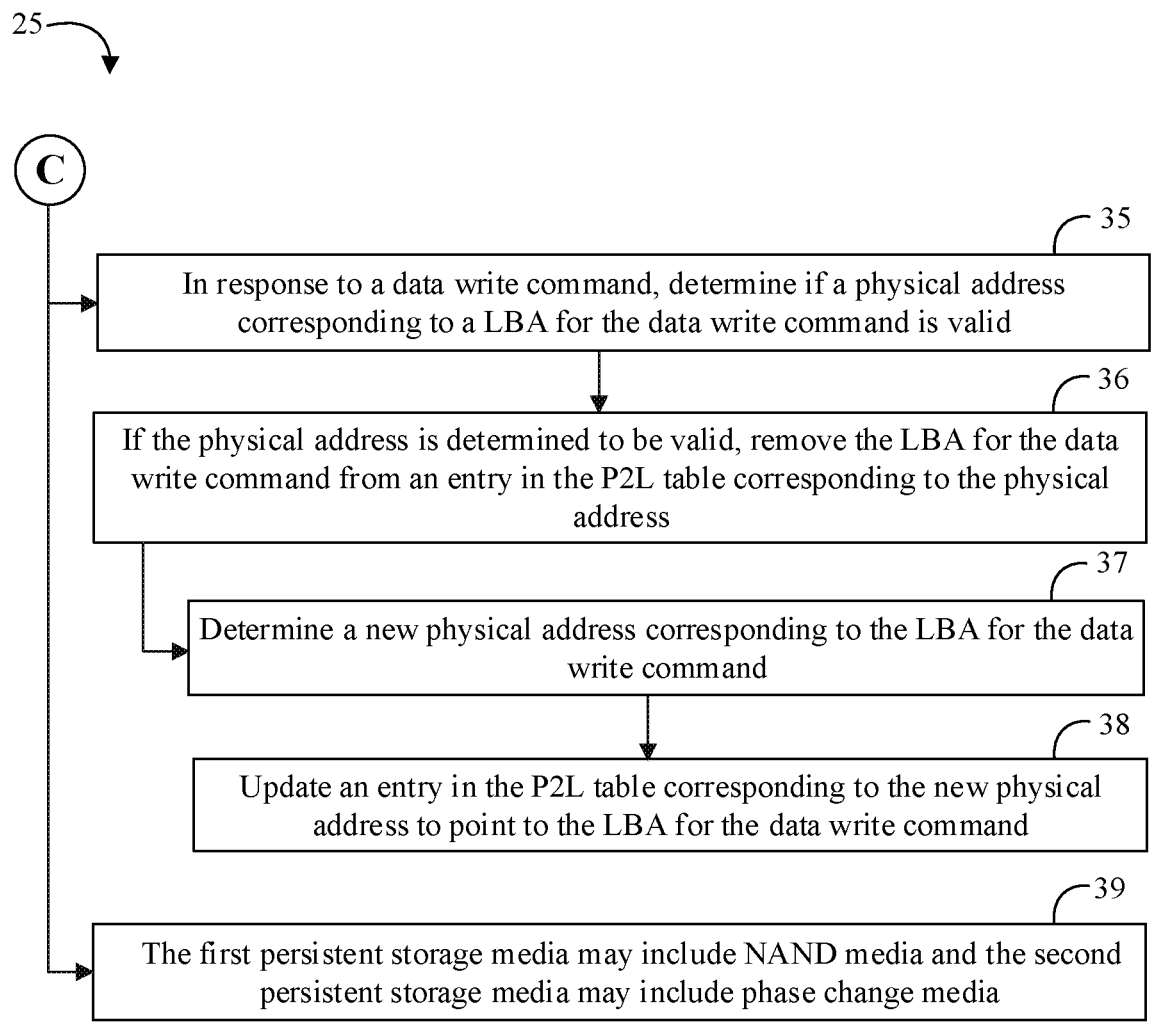

Turning now to FIGS. 3A to 3C, an embodiment of a method 25 of controlling electronic storage may include controlling a first persistent storage media of the electronic storage at block 26, controlling a second persistent storage media of the electronic storage, wherein the second persistent storage media includes one or more of a faster access time and a smaller granularity access as compared to the first persistent storage media, at block 27, storing a L2P table in the second persistent storage media at block 28, and, in response to a data copy command, updating an entry in the L2P table corresponding to a destination LBA for the data copy command to point to a same physical address as a source LBA for the data copy command at block 29. Some embodiments of the method 25 may further include storing a P2L table in the second persistent storage media at block 30, and, in response to the data copy command, updating an entry in the P2L table corresponding to the physical address to point to both the destination LBA for the data copy command and the source LBA for the data copy command at block 31.

Some embodiments of the method 25 may also include trimming the destination LBA prior to the update of the L2P table, at block 32. For example, the method 25 may include invalidating the entry in the L2P table corresponding to the destination LBA at block 33, and removing the destination LBA from the entry in the P2L table corresponding to the physical address at block 34. Some embodiments of the method 25 may also include, in response to a data write command, determining if a physical address corresponding to a LBA for the data write command is valid at block 35, and, if the physical address is determined to be valid, removing the LBA for the data write command from an entry in the P2L table corresponding to the physical address at block 36. For example, the method 25 may further include determining a new physical address corresponding to the LBA for the data write command at block 37, and updating an entry in the P2L table corresponding to the new physical address to point to the LBA for the data write command at block 38. In any of the embodiments herein, the first persistent storage media may include NAND media and the second persistent storage media may include phase change media at block 39.

Embodiments of the method 25 may be implemented in a system, apparatus, computer, device, etc., for example, such as those described herein. More particularly, hardware implementations of the method 25 may include configurable logic such as, for example, PLAs, FPGAs, CPLDs, or in fixed-functionality logic hardware using circuit technology such as, for example, ASIC, CMOS, or TTL technology, or any combination thereof. Alternatively, or additionally, the method 25 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages.

For example, the method 25 may be implemented on a computer readable medium as described in connection with Examples 21 to 27 below. Embodiments or portions of the method 25 may be implemented in firmware, applications (e.g., through an application programming interface (API)), or driver software running on an operating system (OS). Additionally, logic instructions might include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

Some embodiments may advantageously include technology for an on-device-copy on hybrid SSDs without data movement, and with automatic data deduplication. Data copies are a frequent and important operation on almost all compute systems. For example, data copies may be utilized for file defragmentation (defrag), key-value (KV) compaction, backups, and more. In some storage systems, an on-disk-copy functionality may significantly improve performance of these operations. This functionality allows a host to send a data-copy command, with source and destination LBA range(s), to the storage device, and the storage device copies the data from the source to the destination internally. The internal copy operation obviates the need to move data over the external data-bus, and facilitates internal optimizations that the device may do.

A hybrid SSD may incorporate both NAND and PCM media (e.g., INTEL 3DXP memory technology). The use of 3D crosspoint media inside a largely-NAND-based-disk provides opportunities to redesign the data layout and/or improve or optimize applications of the technology. For example, a hybrid SSD's logical-to-physical (L2P) translation table may be kept on the 3DXP media.

While some other SSDs can eliminate external data-transfers with the on-disk-copy operation, these other SSDs may not avoid internal data movement from physical source locations to physical destination locations, corresponding to the specified LBAs. This data movement hurts performance, endurance, and power profiles of the disk. Furthermore, the physical space consumed by the disk is not changed. Each populated LBA continues to require populated physical space, thereby not freeing up physical capacity to reduce write-amplification and obtain further performance and endurance benefits. For example, some other SSDs may require placement of LBA information in each physical page's metadata region, to enable reliable power-loss-recovery. Some other SSDs may not allow in-place update of the LBA information, even in case of data-move (rather than data-copy) commands, forcing relocation of user-data even though the user-data is not modified.

Advantageously, some embodiments provide technology to utilize a fast NV-memory (e.g., 3DXP, PLI backed-up DRAM, etc.) inside a SSD to store the L2P table, and to update the L2P table on data-copy commands so that the destination LBAs point to the same physical address as the source. For example, some embodiments provide technology to remove the LBA information from the physical NAND pages' metadata region, and rely on the fast-NV media to save the L2P persistently. Some embodiments provide a further advantage of an automatic data deduplication capability as well on data-copies. In addition to the performance and endurance benefits noted above, additional deduplication benefits include, among other things, improved cost per GB when coupled with dynamic-capacity techniques.

Some embodiments may still need to maintain P2L information (e.g., stored in the metadata regions of NAND pages). For example, P2L information may be needed for internal-defrag and other operations. Some embodiments may store the P2L information in the fast-NV media, and may extend the P2L information to allow multiple logical locations per physical location. Some embodiments may provide corresponding changes to write, defrag and trim operations. Some embodiments may further provide significant improvements or optimizations that reduce the space requirements and number of 3DXP accesses utilized for indirection management.

Figure 4:
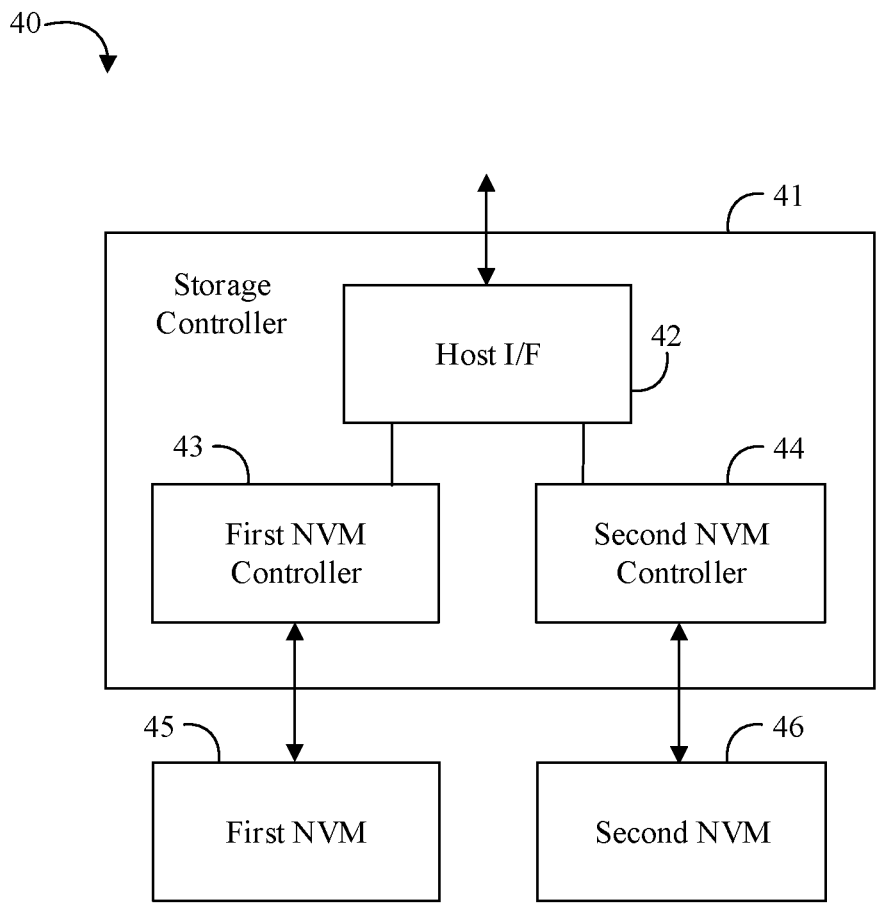
FIG. 4 is a block diagram of an example of a hybrid SSD according to an embodiment.

Turning now to FIG. 4, an embodiment of a hybrid SSD 40 may include a storage controller 41 which includes a host interface (I/F) 42 coupled to a first NVM controller 43 and a second NVM controller 44. The first NVM controller 43 may be coupled to first NVM 45, while the second NVM controller 44 may be coupled to a second NVM 46. For example, the first NVM 45 may include NAND media, while the second NVM 46 may include faster, smaller granularity NV media such as INTEL 3DXP media. In some embodiments, the second NVM controller 44 may be coupled to the first NVM controller 43 instead of, or additionally to, the host interface 42. As an illustrative example, the hybrid SSD 40 may have a 4 KB sector size, a 4 KB indirection unit granularity, and may require a single sector copy command. In some embodiments, the second NVM controller 44 may be configured to store a L2P table in the second NVM 46, and, in response to a data copy command, update an entry in the L2P table corresponding to a destination LBA for the data copy command to point to a same physical address as a source LBA for the data copy command. In some embodiments, the second NVM controller 44 may be further configured to store a P2L table in the second NVM 46, and, in response to the data copy command, update an entry in the P2L table corresponding to the physical address to point to both the destination LBA for the data copy command and the source LBA for the data copy command.

In some embodiments, the second NVM controller 44 may also be configured to trim the destination LBA prior to the update of the L2P table. For example, the second NVM controller 44 may be configured to invalidate the entry in the L2P table corresponding to the destination LBA, and remove the destination LBA from the entry in the P2L table corresponding to the physical address. In some embodiments, the second NVM controller 44 may also be configured to, in response to a data write command, determine if a physical address corresponding to a LBA for the data write command is valid, and, if the physical address is determined to be valid, remove the LBA for the data write command from an entry in the P2L table corresponding to the physical address.

Figure 5:
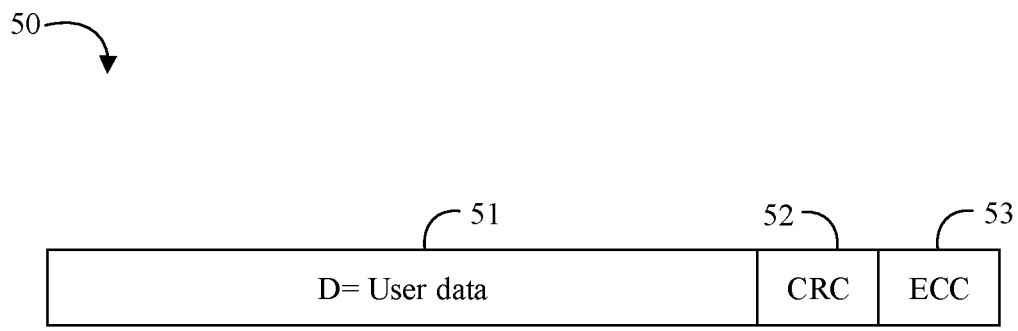
FIG. 5 is an illustrative diagram of an example of a NAND page layout according to an embodiment.

Turning now to FIG. 5, an embodiment of a NAND page-layout 50 for the physical NAND pages' metadata may include data 51 (e.g., including protection information (PI), data integrity field (DIF)/data integrity extension (DIX) information, etc.), a cyclic redundancy check (CRC) 52, and an error correction code (ECC) 53, but does not include the LBA for the data 51. The CRC is also modified to not include the LBA in its calculation because in some embodiments a physical page can be pointed to by multiple logical addresses. All other dependencies to the logical address in the metadata are also moved (e.g., in ECC calculations, etc.).

In some embodiments, a P2L search structure may be maintained on 3DXP media that maps a given physical NAND address to its corresponding LBAs. This search structure may be a lookup table or a hash-table, with chaining, to handle scenarios where a physical page is used by multiple logical pages. Any set of suitable insert/search/delete techniques may be used for the P2L search structure.

Figure 6:
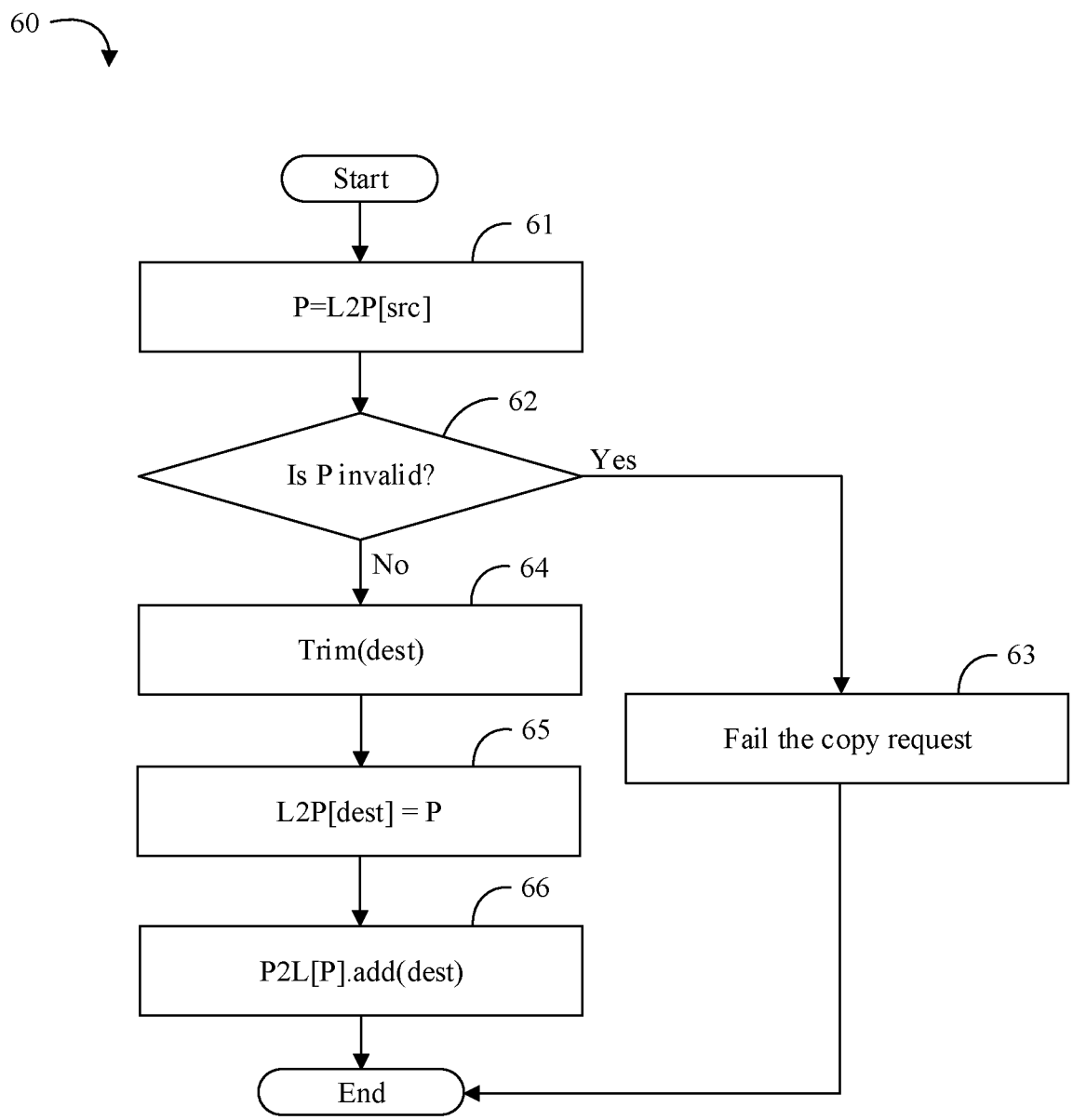
FIG. 6 is a flowchart of an example of a method of on-device copying according to an embodiment.

Turning now to FIG. 6, an embodiment of a method 60 of on-device copying may include setting a physical address (P) to the entry of an L2P table for a source address (src) at block 61 (P=L2P[src]), and determining if the physical address (P) is invalid at block 62. If so, the copy request may fail at block 63, and the method 60 may end/return. Otherwise, the method 60 may include trimming a destination address(dest) at block 64, setting an entry of the L2P table for a destination address (dest) to the physical address (P) at block 65 (L2P[dest]=P), and adding an entry for a P2L table for the physical address (P) to point to the destination address at block 66 (P2L[P].add(dest)).

An SSD may process an On-SSD-Copy(LBA src, LBA dest) command as represented in the following pseudo-code:

```
P = L2P[src]
If (P is invalid)
        fail the copy request, return
end if
Trim(dest)
L2P[dest] = P
P2L[P].add(dest)
```

To process a valid On-SSD-Copy command, the destination LBA (dest) is first trimmed, and then the L2P entry for dest is simply updated to point to the L2P entry P corresponding to src. The P2L structure is updated so that P points to dest as well.

Figure 7:
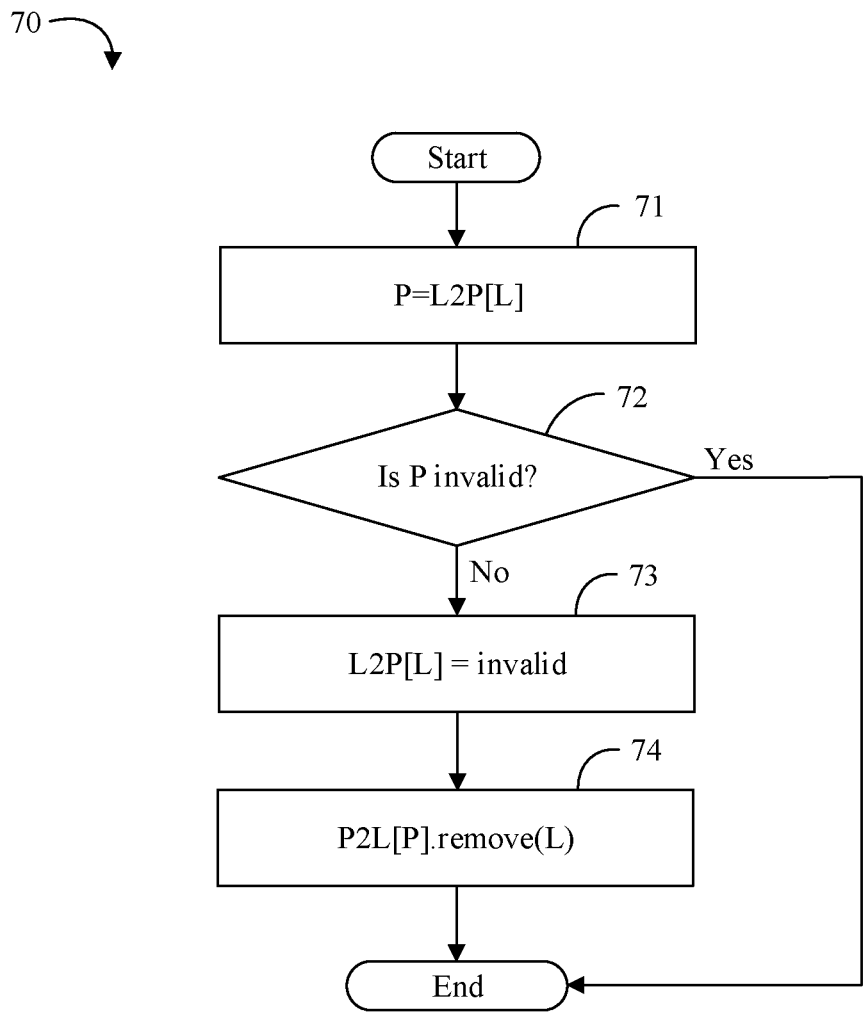
FIG. 7 is a flowchart of an example of a method of trimming according to an embodiment.

Turning now to FIG. 7, an embodiment of a method 70 of trimming may include setting a physical address (P) to the entry of an L2P table for a logical address (L) at block 71 (P=L2P[L]), and determining if the physical address (P) is invalid at block 72. If so, the method 70 may end/return. Otherwise, the method 70 may include setting an entry of the L2P table for the logical address (L) to be invalid at block 73 (L2P[L]=invalid), and removing the logical address (L) from an entry for a P2L table for the physical address (P) at block 74 (P2L[P].remove(L)).

An SSD may process a Trim(LBA L) commands as represented in the following pseudo-code:

```
P = L2P[L]
If (P is invalid) return
L2P[L] = invalid
P2L[P].remove(L)
```

For a valid Trim command, the L2P table is first referenced to determine the corresponding physical page P for the logical address L. The L2P entry for L is nullified, and the P2L entry for P is updated to remove L.

Figure 8:
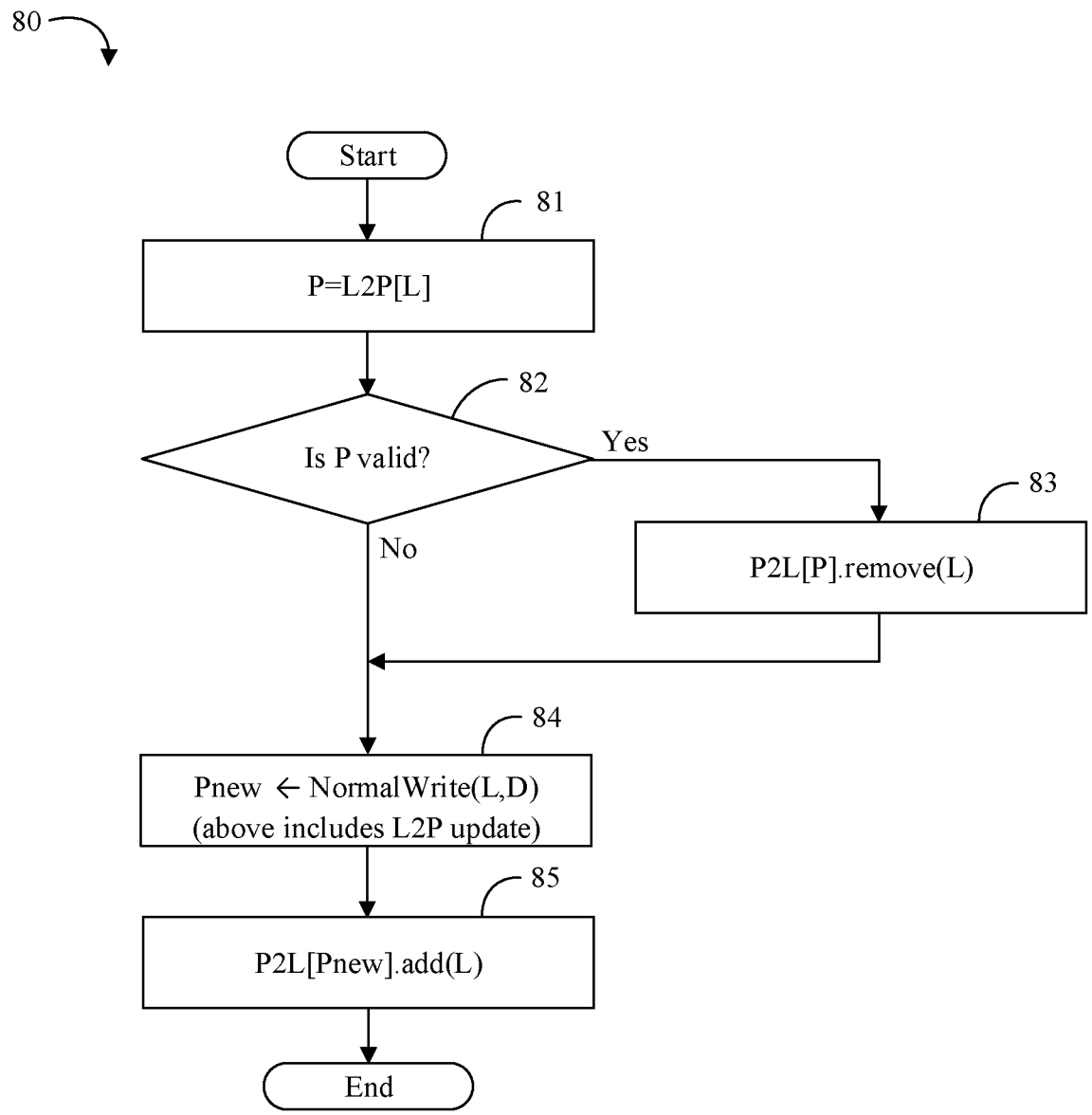
FIG. 8 is a flowchart of an example of a method of writing according to an embodiment.

Turning now to FIG. 8, an embodiment of a method 80 of writing may include setting a physical address (P) to the entry of an L2P table for a logical address (L) at block 81 (P=L2P[L]), and determining if the physical address (P) is valid at block 82. If so, the method 80 may include removing the logical address (L) from an entry for a P2L table for the physical address (P) at block 83 (P2L[P].remove(L)). After block 83, or if P is not valid at block 82, the method 80 may include performing a normal write of data (D) at the logical address (L) at block 84, which returns a new physical address (Pnew) for the data (D) (Pnew<=NormalWrite(L,D), which includes an L2P update). The method 80 may then include adding an entry for the P2L table for the new physical address (Pnew) to point to the logical address (L) at block 85 (P2L[Pnew].add(L)).

An SSD may process a Write(LBA L, Data D) command as represented in the following pseudo-code:

```
P = L2P[L]
If (P is valid)
    P2L[P].remove(L)
end if
Pnew = NormalWrite(L,D)
P2L[Pnew].add(L)
```

For the Write command, the L2P table is first referenced to determine the corresponding physical page P for the logical address L. The P2L entry for this page is updated to remove the reference to L, because L will no longer point to P. The data is then written to NAND, and the P2L information for the new page's physical address Pnew is updated to include L. Write requests with multiple LBAs may be readily supported by looping over each of the LBAs, and calling the Write command for each LBA.

Figure 9:
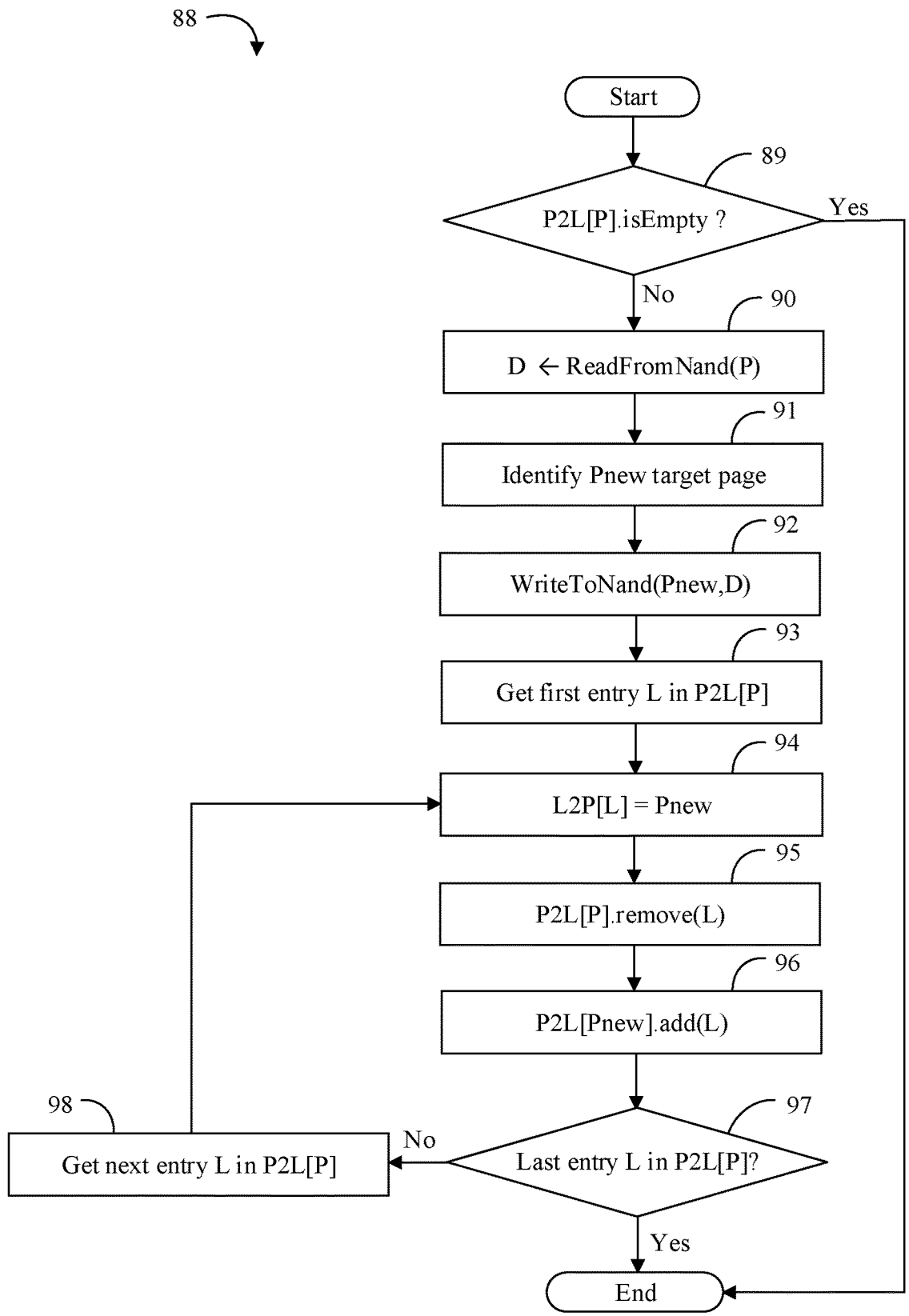
FIG. 9 is a flowchart of an example of a method of defragmenting according to an embodiment.

Turning now to FIG. 9, an embodiment of a method 88 of defragmenting may include determining if a P2L table contains entries for a physical address (P) at block 89 (P2L[P].isEmpty). If empty, the method 88 may end/return. Otherwise, the method 88 may include reading data (D) from the NAND at the physical address (P) at block 90 (D<=ReadFromNand(P)), identifying a new physical address (Pnew) for a target page at block 91, and writing the data (D) to the new physical address (Pnew) at block 92 (WriteToNand(Pnew, D). The method 88 may then include getting a first entry for a logical address (L) in the P2L at the physical address (P) at block 94 and, for each entry L in P2L[P], setting the entry for the L2P at the logical address (L) to the new physical address (Pnew) at block 94 (L2P[L]=Pnew), removing the logical address (L) from an entry for a P2L table for the physical address (P) at block 95 (P2L[P].remove(L)), and adding an entry for the P2L table for the new physical address (Pnew) to point to the logical address (L) at block 84 (P2L[Pnew].add(L)). The method 88 may then include determining if all the entries in the P2L for the physical address (P) have been updated at block 97 and, if not, getting the next entry L in the P2P at block 98 and looping back to block 94 until all the entries have been updated.

An SSD may process a Defrag(Addr P) internal operation as represented in the following pseudo-code:

```
If(! P2L[P].isEmpty)
    D <= ReadFromNand(P)
    Identify Pnew target page
    WriteToNand(Pnew, D)
    for (each entry L in P2L[P])
        L2P[L] = Pnew
        P2L[P].remove(L)
        P2L[Pnew].add(L)
    end for
end if
```

For each NAND page to be defragmented (e.g., potentially relocated), its P2L is first referenced. If the P2L for the NAND page empty, then the page is stale, and does not need to be relocated. Otherwise, the data at P is relocated to a new physical page Pnew per any suitable technique. Then the L2P entries for each L pointing to P are updated to Pnew, and the P2L for P and Pnew are updated to remove and add respectively the entries for L.

Advantageously, one or more of the foregoing aspects of data-layout changes and methods/techniques enable an efficient On-SSD-Copy operation on a hybrid SSD, while providing automatic deduplication benefits (e.g., additional spare capacity that is freed up when Copy commands are used by the host).

If an SSD has a different sector size than its indirection unit granularity (e.g., if the SSD has a 512 B sector size, and a 4 KB indirection granularity), then additional care may be taken to handle mis-aligned requests. An illustrative example may include a 512 B data-copy, trim, and write request, and larger requests that may be coalesced. For example, a write-request for a 512 B sector results in a read-modify-write operation, where the read and write operation are page aligned. A trim-request for a 512 B sector may simply be ignored (Trim is a hint), or may be converted to a WriteZero command if DRAT0 is required. A copy-request for a 512 B sector may be processed as a read followed by write operation, i.e., by not having two L2P entries point to the same physical address, as in conventional Copy handling.

As described above, the P2L table stored in the fast-NV media may be both large and may require multiple accesses. Some embodiments may address this as follows. The data layout on NAND is not modified, i.e., a logical address is stored in metadata for every populated physical page, corresponding to the first write of that data. This information serves as the majority, but not all, of the P2L structure. The L2P table is extended by 1 bit C per entry. This C bit indicates whether the LBA is part of a copy set. A copy set, or a deduplication set, is a collection of LBAs that point to the same data. A Copy-P2L table is maintained in the fast-NV media. This table contains entries for each P that is pointed to by a logical address in a copy-set. The table maintains, for each P it contains, a list of LBAs L pointing to P. Those skilled in the art will appreciate that the foregoing methods of FIGS. 6 to 9 and/or the above pseudo-code may be updated to not lookup P2L table information on functions operating on LBAs L for which L2P[L].C is false. Similarly, the foregoing methods/pseudo-code may be updated to include special case handling for scenarios in which the P2L entries in the Copy-P2L table are shrunk to contain 0 or 1 logical addresses. With the optimization of these embodiments, the P2L advantageously does not take any additional space or operations on the fast-NV media (e.g., 3DXP) if there are no Copy commands that are processed, while only extending the L2P entries by 1 bit. In some embodiments, an SSD may support an internal Copy command, may include both NAND and a fast-NV media (such as 3DXP), and some Copy operations may complete almost instantaneously, with no background I/O to NAND.

The technology discussed herein may be provided in various computing systems (e.g., including a non-mobile computing device such as a desktop, workstation, server, rack system, etc., a mobile computing device such as a smartphone, tablet, Ultra-Mobile Personal Computer (UMPC), laptop computer, ULTRABOOK computing device, smart watch, smart glasses, smart bracelet, etc., and/or a client/edge device such as an Internet-of-Things (IoT) device (e.g., a sensor, a camera, etc.)).

Figure 10:
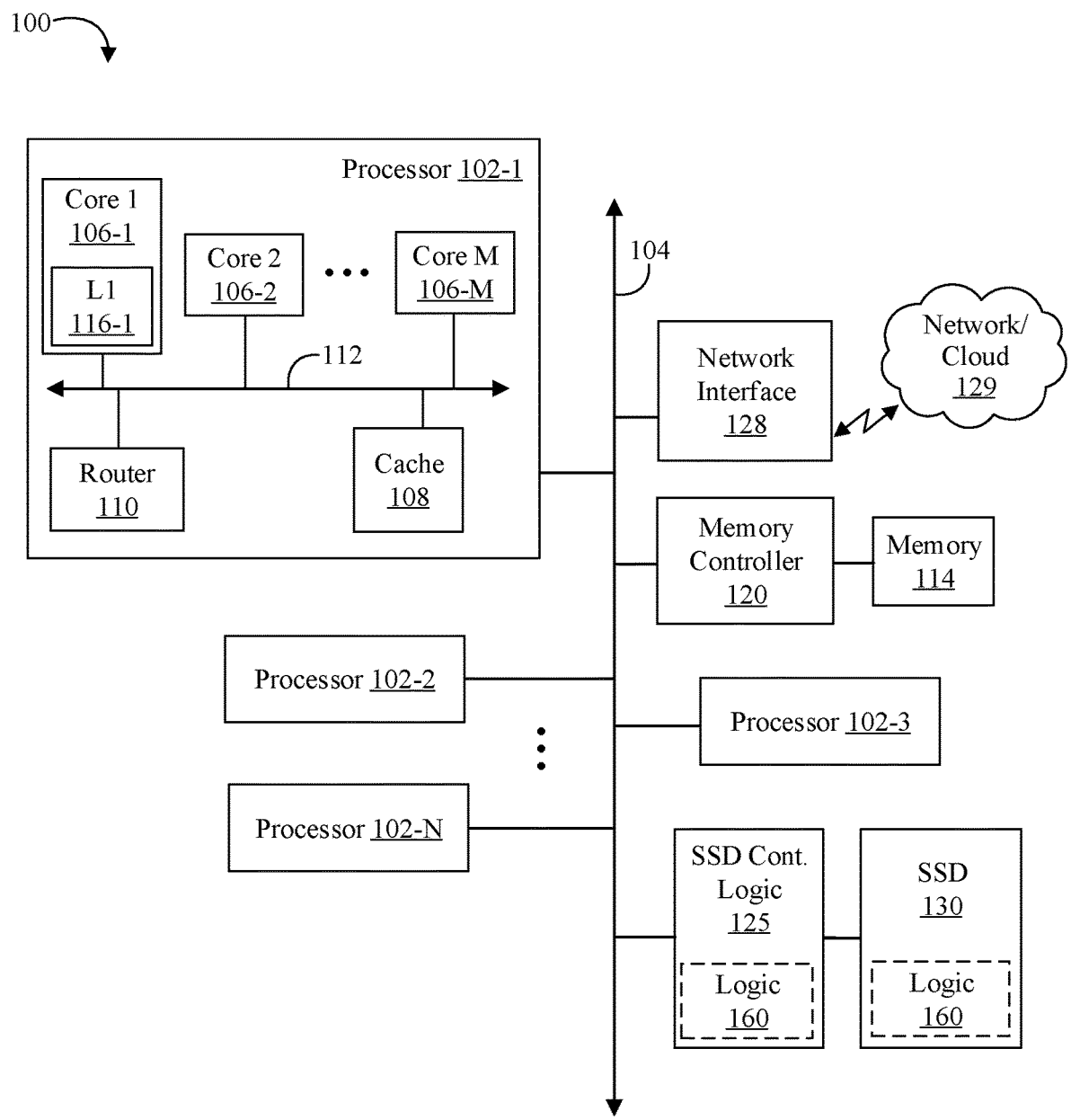
FIG. 10 is a block diagram of an example of a computing system according to an embodiment.

Turning now to FIG. 10, an embodiment of a computing system 100 may include one or more processors 102-1 through 102-N (generally referred to herein as "processors 102" or "processor 102"). The processors 102 may communicate via an interconnection or bus 104. Each processor 102 may include various components some of which are only discussed with reference to processor 102-1 for clarity. Accordingly, each of the remaining processors 102-2 through 102-N may include the same or similar components discussed with reference to the processor 102-1.

In some embodiments, the processor 102-1 may include one or more processor cores 106-1 through 106-M (referred to herein as "cores 106," or more generally as "core 106"), a cache 108 (which may be a shared cache or a private cache in various embodiments), and/or a router 110. The processor cores 106 may be implemented on a single integrated circuit (IC) chip. Moreover, the chip may include one or more shared and/or private caches (such as cache 108), buses or interconnections (such as a bus or interconnection 112), memory controllers, or other components.

In some embodiments, the router 110 may be used to communicate between various components of the processor 102-1 and/or system 100. Moreover, the processor 102-1 may include more than one router 110. Furthermore, the multitude of routers 110 may be in communication to enable data routing between various components inside or outside of the processor 102-1.

The cache 108 may store data (e.g., including instructions) that is utilized by one or more components of the processor 102-1, such as the cores 106. For example, the cache 108 may locally cache data stored in a memory 114 for faster access by the components of the processor 102. As shown in FIG. 10, the memory 114 may be in communication with the processors 102 via the interconnection 104. In some embodiments, the cache 108 (that may be shared) may have various levels, for example, the cache 108 may be a mid-level cache and/or a last-level cache (LLC). Also, each of the cores 106 may include a level 1 (L1) cache (116-1) (generally referred to herein as "L1 cache 116"). Various components of the processor 102-1 may communicate with the cache 108 directly, through a bus (e.g., the bus 112), and/or a memory controller or hub.

As shown in FIG. 10, memory 114 may be coupled to other components of system 100 through a memory controller 120. Memory 114 may include volatile memory and may be interchangeably referred to as main memory. Even though the memory controller 120 is shown to be coupled between the interconnection 104 and the memory 114, the memory controller 120 may be located elsewhere in system 100. For example, memory controller 120 or portions of it may be provided within one of the processors 102 in some embodiments.

The system 100 may communicate with other devices/systems/networks via a network interface 128 (e.g., which is in communication with a computer network and/or the cloud 129 via a wired or wireless interface). For example, the network interface 128 may include an antenna (not shown) to wirelessly (e.g., via an Institute of Electrical and Electronics Engineers (IEEE) 802.11 interface (including IEEE 802.11a/b/g/n/ac, etc.), cellular interface, 3G, 4G, LTE, BLUETOOTH, etc.) communicate with the network/cloud 129.

System 100 may also include Non-Volatile (NV) storage device such as a SSD 130 coupled to the interconnect 104 via SSD controller logic 125. Hence, logic 125 may control access by various components of system 100 to the SSD 130. Furthermore, even though logic 125 is shown to be directly coupled to the interconnection 104 in FIG. 10, logic 125 can alternatively communicate via a storage bus/interconnect (such as the SATA (Serial Advanced Technology Attachment) bus, Peripheral Component Interconnect (PCI) (or PCI EXPRESS (PCIe) interface), NVM EXPRESS (NVMe), etc.) with one or more other components of system 100 (for example where the storage bus is coupled to interconnect 104 via some other logic like a bus bridge, chipset, etc. Additionally, logic 125 may be incorporated into memory controller logic (such as those discussed with reference to FIG. 11) or provided on a same integrated circuit (IC) device in various embodiments (e.g., on the same IC device as the SSD 130 or in the same enclosure as the SSD 130).

Furthermore, logic 125 and/or SSD 130 may be coupled to one or more sensors (not shown) to receive information (e.g., in the form of one or more bits or signals) to indicate the status of or values detected by the one or more sensors. These sensor(s) may be provided proximate to components of system 100 (or other computing systems discussed herein), including the cores 106, interconnections 104 or 112, components outside of the processor 102, SSD 130, SSD bus, SATA bus, logic 125, logic 160, etc., to sense variations in various factors affecting power/thermal behavior of the system/platform, such as temperature, operating frequency, operating voltage, power consumption, and/or inter-core communication activity, etc.

As illustrated in FIG. 10, SSD 130 may include logic 160, which may be in the same enclosure as the SSD 130 and/or fully integrated on a printed circuit board (PCB) of the SSD 130. Advantageously, the logic 160 may include technology to implement one or more aspects of the method 25 (FIGS. 3A to 3C), the method 60 (FIG. 6), the method 70 (FIG. 7), the method 80 (FIG. 8), the method 88 (FIG. 9). For example, the logic 160 may include technology to control NAND media of the SSD 130, control a fast-NV media of the SSD 130, wherein the fast-NV media includes one or more of a faster access time and a smaller granularity access as compared to the NAND media (e.g., byte-addressable as opposed to block-addressable), store a L2P table in the fast-NV media, and, in response to a data copy command, update an entry in the L2P table corresponding to a destination LBA for the data copy command to point to a same physical address as a source LBA for the data copy command. In some embodiments, the logic 160 may be further configured to store a P2L table in the fast-NV media, and, in response to the data copy command, update an entry in the P2L table corresponding to the physical address to point to both the destination LBA for the data copy command and the source LBA for the data copy command.

In some embodiments, the logic 160 may also be configured to trim the destination LBA prior to the update of the L2P table. For example, the logic 160 may be configured to invalidate the entry in the L2P table corresponding to the destination LBA, and remove the destination LBA from the entry in the P2L table corresponding to the physical address. In some embodiments, the logic 160 may also be configured to, in response to a data write command, determine if a physical address corresponding to a LBA for the data write command is valid, and, if the physical address is determined to be valid, remove the LBA for the data write command from an entry in the P2L table corresponding to the physical address.

In other embodiments, the SSD 130 may be replaced with any suitable persistent storage technology/media. In some embodiments, the logic 160 may be coupled to one or more substrates (e.g., silicon, sapphire, gallium arsenide, printed circuit board (PCB), etc.), and may include transistor channel regions that are positioned within the one or more substrates. As shown in FIG. 10, features or aspects of the logic 160 may be distributed throughout the SSD 130, and/or co-located/integrated with various components of the SSD 130.

Figure 11:
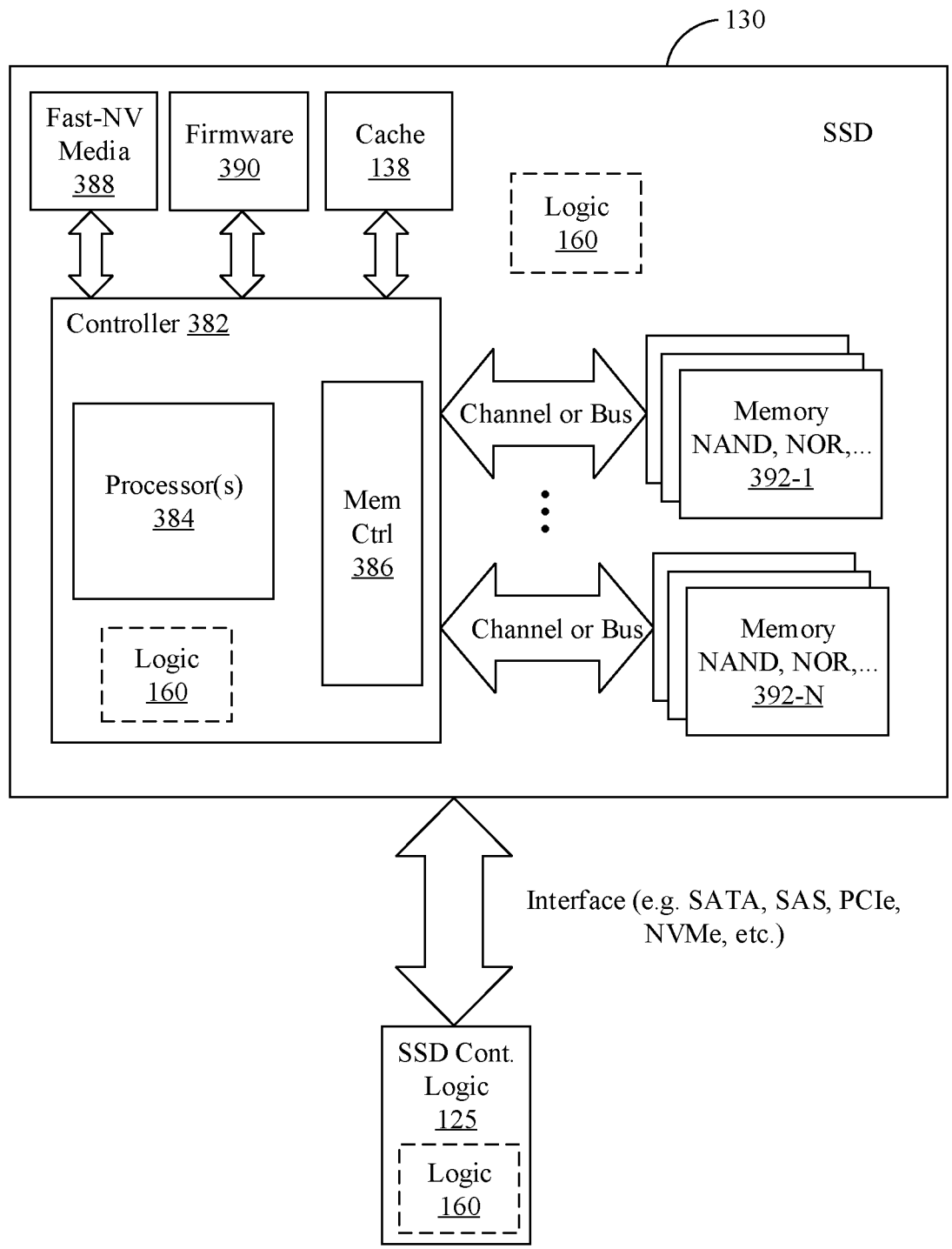
FIG. 11 is a block diagram of an example of a SSD according to an embodiment.

FIG. 11 illustrates a block diagram of various components of the SSD 130, according to an embodiment. As illustrated in FIG. 11, logic 160 may be located in various locations such as inside the SSD 130 or controller 382, etc., and may include similar technology as discussed in connection with FIG. 10. SSD 130 includes a controller 382 (which in turn includes one or more processor cores or processors 384 and memory controller logic 386), cache 138, fast-NV media 388 (e.g., 3DXP, IPL backed-up DRAM, etc.), firmware storage 390, and one or more memory modules or dies 392-1 to 392-N (which may include NAND flash, NOR flash, or other types of non-volatile memory). Memory modules 392-1 to 392-N are coupled to the memory controller logic 386 via one or more memory channels or busses. Also, SSD 130 communicates with logic 125 via an interface (such as a SATA, SAS, PCIe, NVMe, etc., interface). One or more of the features/aspects/operations discussed with reference to FIGS. 1-9 may be performed by one or more of the components of FIG. 11. Processors 384 and/or controller 382 may compress/decompress (or otherwise cause compression/decompression of) data written to or read from memory modules 392-1 to 392-N. Also, one or more of the features/aspects/operations of FIGS. 1-9 may be programmed into the firmware 390. Further, SSD controller logic 125 may also include logic 160.

Additional Notes and Examples

Example 1 includes a package apparatus for use with electronic storage, comprising one or more substrates, and logic coupled to the one or more substrates, wherein the logic is at least partly implemented in one or more of configurable logic and fixed-functionality hardware logic, the logic coupled to the one or more substrates to control a first persistent storage media of the electronic storage, control a second persistent storage media of the electronic storage, wherein the second persistent storage media includes one or more of a faster access time and a smaller granularity access as compared to the first persistent storage media, store a logical-to-physical table in the second persistent storage media, and in response to a data copy command, update an entry in the logical-to-physical table corresponding to a destination logical block address for the data copy command to point to a same physical address as a source logical block address for the data copy command.

Example 2 includes the apparatus of Example 1, wherein the logic is further to store a physical-to-logical table in the second persistent storage media, and in response to the data copy command, update an entry in the physical-to-logical table corresponding to the physical address to point to both the destination logical block address for the data copy command and the source logical block address for the data copy command.

Example 3 includes the apparatus of any of Examples 1 to 2, wherein the logic is further to trim the destination logical block address prior to the update of the logical-to-physical table.

Example 4 includes the apparatus of Example 3, wherein the logic is further to invalidate the entry in the logical-to-physical table corresponding to the destination logical block address, and remove the destination logical block address from the entry in the physical-to-logical table corresponding to the physical address.

Example 5 includes the apparatus of any of Examples 1 to 4, wherein the logic is further to in response to a data write command, determine if a physical address corresponding to a logical block address for the data write command is valid, and if the physical address is determined to be valid, remove the logical block address for the data write command from an entry in the physical-to-logical table corresponding to the physical address.

Example 6 includes the apparatus of any of Examples 1 to 5, wherein the first persistent storage media comprises NAND media and wherein the second persistent storage media comprises phase change media.

Example 7 includes the apparatus of any of Examples 1 to 6, wherein the logic coupled to the one or more substrates includes transistor channel regions that are positioned within the one or more substrates.

Example 8 includes an electronic storage system, comprising a first persistent storage media, a second persistent storage media, wherein the second persistent storage media includes one or more of a faster access time and a smaller granularity access as compared to the first persistent storage media, a first controller communicatively coupled to the first persistent storage media, and a second controller communicatively coupled to the second persistent storage media, the second controller including logic to store a logical-to-physical table in the second persistent storage media, and in response to a data copy command, update an entry in the logical-to-physical table corresponding to a destination logical block address for the data copy command to point to a same physical address as a source logical block address for the data copy command.

Example 9 includes the system of Example 8, wherein the logic is further to store a physical-to-logical table in the second persistent storage media, and in response to the data copy command, update an entry in the physical-to-logical table corresponding to the physical address to point to both the destination logical block address for the data copy command and the source logical block address for the data copy command.

Example 10 includes the system of any of Examples 8 to 9, wherein the logic is further to trim the destination logical block address prior to the update of the logical-to-physical table.

Example 11 includes the system of Example 10, wherein the logic is further to invalidate the entry in the logical-to-physical table corresponding to the destination logical block address, and remove the destination logical block address from the entry in the physical-to-logical table corresponding to the physical address.

Example 12 includes the system of any of Examples 8 to 11, wherein the logic is further to in response to a data write command, determine if a physical address corresponding to a logical block address for the data write command is valid, and if the physical address is determined to be valid, remove the logical block address for the data write command from an entry in the physical-to-logical table corresponding to the physical address.

Example 13 includes the system of any of Examples 8 to 12, wherein the first persistent storage media comprises NAND media and wherein the second persistent storage media comprises phase change media.

Example 14 includes a method of controlling electronic storage, comprising controlling a first persistent storage media of the electronic storage, controlling a second persistent storage media of the electronic storage, wherein the second persistent storage media includes one or more of a faster access time and a smaller granularity access as compared to the first persistent storage media, storing a logical-to-physical table in the second persistent storage media, and in response to a data copy command, updating an entry in the logical-to-physical table corresponding to a destination logical block address for the data copy command to point to a same physical address as a source logical block address for the data copy command.

Example 15 includes the method of Example 14, further comprising storing a physical-to-logical table in the second persistent storage media, and in response to the data copy command, updating an entry in the physical-to-logical table corresponding to the physical address to point to both the destination logical block address for the data copy command and the source logical block address for the data copy command.

Example 16 includes the method of any of Examples 14 to 15, further comprising trimming the destination logical block address prior to the update of the logical-to-physical table.

Example 17 includes the method of Example 16, further comprising invalidating the entry in the logical-to-physical table corresponding to the destination logical block address, and removing the destination logical block address from the entry in the physical-to-logical table corresponding to the physical address.

Example 18 includes the method of any of Examples 14 to 17, further comprising in response to a data write command, determining if a physical address corresponding to a logical block address for the data write command is valid, and if the physical address is determined to be valid, removing the logical block address for the data write command from an entry in the physical-to-logical table corresponding to the physical address.

Example 19 includes the method of Example 18, further comprising determining a new physical address corresponding to the logical block address for the data write command, and updating an entry in the physical-to-logical table corresponding to the new physical address to point to the logical block address for the data write command.

Example 20 includes the method of any of Examples 14 to 19, wherein the first persistent storage media comprises NAND media and wherein the second persistent storage media comprises phase change media.

Example 21 includes at least one computer readable storage medium, comprising a set of instructions, which when executed by a computing device, cause the computing device to control a first persistent storage media of the electronic storage, control a second persistent storage media of the electronic storage, wherein the second persistent storage media includes one or more of a faster access time and a smaller granularity access as compared to the first persistent storage media, store a logical-to-physical table in the second persistent storage media, and in response to a data copy command, update an entry in the logical-to-physical table corresponding to a destination logical block address for the data copy command to point to a same physical address as a source logical block address for the data copy command.

Example 22 includes the at least one computer readable storage medium of Example 21, comprising a further set of instructions, which when executed by the computing device, cause the computing device to store a physical-to-logical table in the second persistent storage media, and in response to the data copy command, update an entry in the physical-to-logical table corresponding to the physical address to point to both the destination logical block address for the data copy command and the source logical block address for the data copy command.

Example 23 includes the at least one computer readable storage medium of any of Examples 21 to 22, comprising a further set of instructions, which when executed by the computing device, cause the computing device to trim the destination logical block address prior to the update of the logical-to-physical table.

Example 24 includes the at least one computer readable storage medium of Example 23, comprising a further set of instructions, which when executed by the computing device, cause the computing device to invalidate the entry in the logical-to-physical table corresponding to the destination logical block address, and remove the destination logical block address from the entry in the physical-to-logical table corresponding to the physical address.

Example 25 includes the at least one computer readable storage medium of Examples 21 to 24, comprising a further set of instructions, which when executed by the computing device, cause the computing device to in response to a data write command, determine if a physical address corresponding to a logical block address for the data write command is valid, and if the physical address is determined to be valid, remove the logical block address for the data write command from an entry in the physical-to-logical table corresponding to the physical address.

Example 26 includes the at least one computer readable storage medium of Example 25, comprising a further set of instructions, which when executed by the computing device, cause the computing device to determine a new physical address corresponding to the logical block address for the data write command, and update an entry in the physical-to-logical table corresponding to the new physical address to point to the logical block address for the data write command.

Example 27 includes the at least one computer readable medium storage medium of Examples 21 to 26, wherein the first persistent storage media comprises NAND media and wherein the second persistent storage media comprises phase change media.

Example 28 includes an electronic storage controller apparatus, comprising means for controlling a first persistent storage media of the electronic storage, means for controlling a second persistent storage media of the electronic storage, wherein the second persistent storage media includes one or more of a faster access time and a smaller granularity access as compared to the first persistent storage media, means for storing a logical-to-physical table in the second persistent storage media, and means for updating, in response to a data copy command, an entry in the logical-to-physical table corresponding to a destination logical block address for the data copy command to point to a same physical address as a source logical block address for the data copy command.

Example 29 includes the apparatus of Example 28, further comprising means for storing a physical-to-logical table in the second persistent storage media, and means for updating, in response to the data copy command, an entry in the physical-to-logical table corresponding to the physical address to point to both the destination logical block address for the data copy command and the source logical block address for the data copy command.

Example 30 includes the apparatus of any of Examples 28 to 29, further comprising means for trimming the destination logical block address prior to the update of the logical-to-physical table.

Example 31 includes the apparatus of Example 30, further comprising means for invalidating the entry in the logical-to-physical table corresponding to the destination logical block address, and means for removing the destination logical block address from the entry in the physical-to-logical table corresponding to the physical address.

Example 32 includes the apparatus of any of Examples 28 to 31, further comprising means for determining, in response to a data write command, if a physical address corresponding to a logical block address for the data write command is valid, and means for removing the logical block address for the data write command from an entry in the physical-to-logical table corresponding to the physical address, if the physical address is determined to be valid.

Example 33 includes the apparatus of Example 32, further comprising means for determining a new physical address corresponding to the logical block address for the data write command, and means for updating an entry in the physical-to-logical table corresponding to the new physical address to point to the logical block address for the data write command.

Example 34 includes the apparatus of any of Examples 28 to 33, wherein the first persistent storage media comprises NAND media and wherein the second persistent storage media comprises phase change media.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A package apparatus for use with electronic storage, comprising:
   one or more substrates; and
   logic coupled to the one or more substrates, wherein the logic is at least partly implemented in one or more of configurable logic and fixed-functionality hardware logic, the logic coupled to the one or more substrates to:
      control a first persistent storage media included in a hybrid solid state drive of the electronic storage to store data without an associated logical block address,
      control a second persistent storage media included in the hybrid solid state drive of the electronic storage, wherein the second persistent storage media includes one or more of a faster access time and a smaller granularity access as compared to the first persistent storage media,
      store a logical-to-physical table and a physical-to-logical table in the second persistent storage media,
      in response to a data copy command, update an entry in the logical-to-physical table corresponding to a destination logical block address for the data copy command to point to a same physical address as a source logical block address for the data copy command, wherein the second persistent storage media maps a physical address of the first persistent storage media to the associated logical block address, and
      extend entries of the logical-to-physical table by only one bit per entry to indicate whether a particular logical block address is part of a copy set, wherein the copy set is a of a collection of logical block addresses that point to a related set of data, and extend entries of the physical-to-logical table to associate multiple logical locations per physical location.

2. The package apparatus of claim 1, wherein the logic is further to:
   in response to the data copy command, update an entry in the physical-to-logical table corresponding to the physical address to point to both the destination logical block address for the data copy command and the source logical block address for the data copy command.

3. The package apparatus of claim 1, wherein the logic is further to:
trim the destination logical block address prior to the update of the logical-to-physical table.

4. The package apparatus of claim 3, wherein the logic is further to:
invalidate the entry in the logical-to-physical table corresponding to the destination logical block address; and
remove the destination logical block address from the entry in the physical-to-logical table corresponding to the physical address.

5. The package apparatus of claim 1, wherein the logic is further to:
in response to a data write command, determine if the physical address corresponding to a logical block address for the data write command is valid; and
if the physical address is determined to be valid, remove the logical block address for the data write command from an entry in the physical-to-logical table corresponding to the physical address.

6. The package apparatus of claim 1, wherein the first persistent storage media comprises NAND media and wherein the second persistent storage media comprises phase change media.

7. The package apparatus of claim 1, wherein the logic coupled to the one or more substrates includes transistor channel regions that are positioned within the one or more substrates.

8. An electronic storage system, comprising:
a first persistent storage media included in a hybrid solid state drive;
a second persistent storage media included in the hybrid solid state drive, wherein the second persistent storage media includes one or more of a faster access time and a smaller granularity access as compared to the first persistent storage media;
a first controller communicatively coupled to the first persistent storage media to store data without an associated logical block address; and
a second controller communicatively coupled to the second persistent storage media, the second controller including logic to:
store a logical-to-physical table and a physical-to-logical table in the second persistent storage media,
in response to a data copy command, update an entry in the logical-to-physical table corresponding to a destination logical block address for the data copy command to point to a same physical address as a source logical block address for the data copy command, wherein the second persistent storage media maps a physical address of the first persistent storage media to the associated logical block address, and
extend entries of the logical-to-physical table by only one bit per entry to indicate whether a particular logical block address is part of a copy set, wherein the copy set is a of a collection of logical block addresses that point to a related set of data, and extend entries of the physical-to-logical table to associate multiple logical locations per physical location.

9. The electronic storage system of claim 8, wherein the logic is further to:
in response to the data copy command, update an entry in the physical-to-logical table corresponding to the physical address to point to both the destination logical block address for the data copy command and the source logical block address for the data copy command.

10. The electronic storage system of claim 8, wherein the logic is further to:
trim the destination logical block address prior to the update of the logical-to-physical table.

11. The electronic storage system of claim 10, wherein the logic is further to:
invalidate the entry in the logical-to-physical table corresponding to the destination logical block address; and
remove the destination logical block address from the entry in the physical-to-logical table corresponding to the physical address.

12. The electronic storage system of claim 8, wherein the logic is further to:
in response to a data write command, determine if the physical address corresponding to a logical block address for the data write command is valid; and
if the physical address is determined to be valid, remove the logical block address for the data write command from an entry in the physical-to-logical table corresponding to the physical address.

13. The electronic storage system of claim 8, wherein the first persistent storage media comprises NAND media and wherein the second persistent storage media comprises phase change media.

14. A method of controlling electronic storage, comprising:
controlling a first persistent storage media included in a hybrid solid state drive of the electronic storage to store data without an associated logical block address;
controlling a second persistent storage media included in the hybrid solid state drive of the electronic storage, wherein the second persistent storage media includes one or more of a faster access time and a smaller granularity access as compared to the first persistent storage media;
storing a logical-to-physical table and a physical-to-logical table in the second persistent storage media;
in response to a data copy command, updating an entry in the logical-to-physical table corresponding to a destination logical block address for the data copy command to point to a same physical address as a source logical block address for the data copy command, wherein the second persistent storage media maps a physical address of the first persistent storage media to the associated logical block address; and
extending entries of the logical-to-physical table by only one bit per entry to indicate whether a particular logical block address is part of a copy set, wherein the copy set is a of a collection of logical block addresses that point to a related set of data, and extending entries of the physical-to-logical table to associate multiple logical locations per physical location.

15. The method of claim 14, further comprising:
in response to the data copy command, updating an entry in the physical-to-logical table corresponding to the physical address to point to both the destination logical block address for the data copy command and the source logical block address for the data copy command.

16. The method of claim 14, further comprising:
trimming the destination logical block address prior to the update of the logical-to-physical table.

17. The method of claim 16, further comprising:
invalidating the entry in the logical-to-physical table corresponding to the destination logical block address; and
removing the destination logical block address from the entry in the physical-to-logical table corresponding to the physical address.

18. The method of claim 14, further comprising:
in response to a data write command, determining if the physical address corresponding to a logical block address for the data write command is valid; and
if the physical address is determined to be valid, removing the logical block address for the data write command from an entry in the physical-to-logical table corresponding to the physical address.

19. The method of claim 18, further comprising:
determining a new physical address corresponding to the logical block address for the data write command; and
updating an entry in the physical-to-logical table corresponding to the new physical address to point to the logical block address for the data write command.

20. The method of claim 14, wherein the first persistent storage media comprises NAND media and wherein the second persistent storage media comprises phase change media.

* * * * *